(12) United States Patent
Hartanto et al.

(10) Patent No.: US 8,311,762 B1
(45) Date of Patent: Nov. 13, 2012

(54) MANUFACTURING TEST FOR A PROGRAMMABLE INTEGRATED CIRCUIT IMPLEMENTING A SPECIFIC USER DESIGN

(75) Inventors: Ismed D. Hartanto, Castro Valley, CA (US); Andrew M. Taylor, Campbell, CA (US); Shahin Toutounchi, Pleasanton, CA (US)

(73) Assignee: Xilinx, Inc., San Jose, CA (US)

( * ) Notice: Subject to any disclaimer, the term of this patent is extended or adjusted under 35 U.S.C. 154(b) by 264 days.

(21) Appl. No.: 12/885,222

(22) Filed: Sep. 17, 2010

(51) Int. Cl.
*G01R 27/28* (2006.01)
(52) U.S. Cl. ...................................... 702/117
(58) Field of Classification Search ............... 702/117
See application file for complete search history.

(56) References Cited

U.S. PATENT DOCUMENTS

| | | | |
|---|---|---|---|
| 6,664,808 B2 | 12/2003 | Ling et al. |
| 6,817,006 B1 | 11/2004 | Wells et al. |
| 6,891,395 B2 | 5/2005 | Wells et al. |
| 6,920,621 B1 | 7/2005 | Toutounchi et al. |
| 7,007,250 B1 | 2/2006 | Bapat et al. |
| 7,127,697 B1 | 10/2006 | Wells et al. |
| 7,143,295 B1 | 11/2006 | Trimberger |
| 7,219,314 B1 | 5/2007 | Trimberger et al. |
| 7,310,758 B1 | 12/2007 | Cossoul et al. |
| 7,315,972 B1 | 1/2008 | Bapat |
| 7,430,697 B1 | 9/2008 | Pabari |
| 7,454,675 B1 | 11/2008 | Wells et al. |
| 7,469,371 B1 | 12/2008 | Bapat et al. |
| 7,525,331 B1 | 4/2009 | Jairam et al. |
| 7,526,694 B1 | 4/2009 | Jairam et al. |
| 7,603,599 B1 | 10/2009 | Cossoul et al. |
| 7,614,022 B1 | 11/2009 | Chari |
| 7,725,787 B1 | 5/2010 | Wells et al. |
| 2004/0216081 A1* | 10/2004 | Wells et al. ............... 716/18 |

OTHER PUBLICATIONS

U.S. Appl. No. 11/639,996, filed Dec. 14, 2006, Moore.
U.S. Appl. No. 12/043,825, filed Mar. 6, 2008, Jairam et al.
U.S. Appl. No. 12/192,741, filed Aug. 15, 2008, Pabari.
Dutton, Bradley F. et al., "Soft-Core Embedded Processor-Based Built-In Self-Test of FPGAs: A Case Study," *Proc. of the 42nd South Eastern Symposium on System Theory*, Mar. 7, 2010, pp. 313-317, IEEE, Piscataway, New Jersey, USA.

(Continued)

*Primary Examiner* — Tung S Lau
(74) *Attorney, Agent, or Firm* — LeRoy D. Maunu; Lois D. Cartier

(57) ABSTRACT

Methods and systems generate a manufacturing test of a programmable integrated circuit and optionally test the programmable integrated circuit with the manufacturing test. A netlist is generated that represents a specific user design implemented in programmable resources of the programmable integrated circuit. The netlist represents user registers that are implemented in a portion of the logic registers of the programmable logic resources. A virtual scan chain is added to the netlist. Scan-test vectors are generated from the netlist using automatic test pattern generation (ATPG). The scan-test vectors serially scan the portion of the logic registers via the virtual scan chain. The scan-test vectors are converted into access-test vectors that access the portion of the logic registers via a configuration port of the programmable integrated circuit. The programmable integrated circuit is optionally tested for a manufacturing defect with the access-test vectors.

17 Claims, 4 Drawing Sheets

OTHER PUBLICATIONS

Renovell, M. et al., "IS-FPGA: A New Symmetric FPGA Architecture with Implicit SCAN," *Proc. of the 2001 ITC International Test Conference*, Oct. 30, 2001, pp. 924-931, IEEE, Piscataway, New Jersey, USA.

Stroud, Charles et al., "Evaluation of FPGA Resources for Built-In Self-Test of Programmable Logic Blocks,"*Proc. of the 1996 Fourth International ACM/SIGDA Symposium on Field Programmable Gate Arrays*, Feb. 11, 1996, pp. 107-113, IEEE, Piscataway, New Jersey, USA.

Wheeler, Timothy et al., "Using Design-Level Scan to Improve FPGA Design Observability and Controllability for Function Verification," Jan. 1, 2001, pp. 483-492, Springer-Verlag, Berlin/Heidelberg, Germany.

* cited by examiner

MANUFACTURING TEST FOR A PROGRAMMABLE INTEGRATED CIRCUIT IMPLEMENTING A SPECIFIC USER DESIGN

FIELD OF THE INVENTION

One or more embodiments generally relate to manufacturing tests for integrated circuits, and more particularly to manufacturing tests for specifically programmed integrated circuits.

BACKGROUND

Programmable logic devices (PLDs) are programmable integrated circuits that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

A programmable integrated circuit might not properly implement a specified logic function when the programmable integrated circuit has manufacturing defects. However, it is time consuming and expensive to generate and apply a manufacturing test for a programmable integrated circuit.

The present invention may address one or more of the above issues.

SUMMARY

According to one embodiment, a method of generating a manufacturing test of a programmable integrated circuit is provided. One or more processors are programmed to perform a number of operations. The operations include generating a netlist representing a specific user design that is implemented in programmable resources of the programmable integrated circuit. The netlist represents the specific user design's user registers that are implemented in a portion of the logic registers of the programmable logic resources. The operations also include adding to the netlist a virtual scan chain through the portion of the logic registers, and generating scan-test vectors from the netlist using automatic test pattern generation (ATPG). The scan-test vectors serially scan the portion of the logic registers via the virtual scan chain. The operations further include converting the scan-test vectors into access-test vectors that access the portion of the logic registers via a configuration port of the programmable integrated circuit.

In another embodiment, the adding of the virtual scan chain to the netlist includes adding to the netlist the virtual scan chain that does not exist in the programmable integrated circuit and does not exist in the specific user design implemented in the programmable resources of the programmable integrated circuit.

The generating of the scan-test vectors, in another embodiment, includes performing the ATPG that generates the scan-test vectors which collectively cover all of a plurality of potential stuck-at faults of the specific user design implemented in the programmable resources.

In another embodiment, the generating of the netlist includes inputting a specification of the specific user design, generating a circuit description mapping the specification into the programmable resources of the programmable integrated circuit, and generating the netlist from the circuit description.

In another embodiment, a method is provided for manufacturing testing of a programmable integrated circuit that is implementing a specific user design. The method includes using at least one programmed processor to perform a number of operations. The operations include generating a netlist representing the specific user design implemented in of programmable resources of the programmable integrated circuit. The netlist represents a plurality of user registers of the specific user design implemented in a portion of a plurality of logic registers of the programmable resources. The method further includes adding a virtual scan chain through the portion of the logic registers to the netlist, and generating a plurality of scan-test vectors from the netlist using automatic test pattern generation (ATPG). The scan-test vectors serially scan the portion of the logic registers via the virtual scan chain. The scan-test vectors are converted into a plurality of access-test vectors that access the portion of the logic registers via a configuration port of the programmable integrated circuit. The method includes testing whether the programmable integrated circuit has a manufacturing defect, including testing the programmable integrated circuit implementing the specific user design with each of the access-test vectors via the configuration port.

The testing for the manufacturing defect in the programmable integrated circuit, in another embodiment, includes generating configuration data from the circuit description and storing the configuration data in a configuration memory of the programmable integrated circuit via the configuration port. The programmable integrated circuit implements the specific user design in response to the configuration memory storing the configuration data.

In another embodiment, the inputting of the specification includes inputting the specification specifying the user registers and a plurality of input and output signals of the specific user design. The generating of the circuit description includes generating the circuit description mapping the user registers into the portion of the logic registers, and mapping the input and output signals to a plurality of pins of the programmable resources of the programmable integrated circuit. The generating of the netlist from the circuit description includes generating the netlist representing the programmable resources that implement the specific user design. The netlist represents the programmable resources as configured by the configuration data stored in the configuration memory. The generating of the scan-test vectors includes generating an initial state and an expected state for the user registers implemented in the portion of the logic registers, and generating a plurality of input values for the input signals and a plurality of expected values for the output signals.

The testing of the programmable integrated circuit with each of the access-test vectors, in another embodiment, includes initializing the portion of the logic registers with the initial state via the configuration port and the configuration memory and applying the input values to the pins to which the input signals are mapped. The testing also includes capturing a plurality of output values from the pins to which the output signals are mapped and sampling a final state of the portion of the logic registers via the configuration memory and the configuration port. In response to the output values matching the expected values and the final state matching the expected state, the testing determines the programmable integrated circuit implementing the specific user design does not have the manufacturing defect.

In another embodiment, the testing of the programmable integrated circuit with the access-test vector includes stepping a clock signal for the portion of the logic registers during the applying and the capturing. The initializing includes writing the initial state into a plurality of addressable words within the configuration memory via the configuration port, and issuing an initialize command to the configuration port for initializing all of the logic registers from the configuration memory. The initial state is transferred from the addressable words within the configuration memory to the portion of the logic registers. The sampling of the final state includes issuing a sample command to the configuration port for sampling all of the logic registers into the configuration memory. The final state is transferred from the portion of the logic registers to the addressable words within the configuration memory, and the final state is read from the addressable words within the configuration memory via the configuration port.

The generating of the scan-test vectors, in another embodiment, includes generating each scan-test vector specifying an initial and expected state of the user registers. The testing of the programmable integrated circuit with each of the access-test vectors includes determining the programmable integrated circuit implementing the specific user design has the manufacturing defect in response to, for the access-test vector that corresponds to each of the scan-test vectors, a final state of the portion of the logic registers for the access-test vector not matching the expected state of the user registers for the scan-test vector.

In another embodiment, the generating of the scan-test vectors further includes a tool for the ATPG generating the scan-test vectors augmented with at least one additional scan-test vector for diagnosing and localizing the manufacturing defect in response to at least one bit of the final state not matching a corresponding at least one bit of the expected state. The testing for the manufacturing defect in the programmable integrated circuit includes diagnosing and localizing the manufacturing defect in response to testing the programmable integrated circuit via the configuration port with the access-test vectors that correspond to the at least one additional scan-test vector.

The generating of the scan-test vectors, in another embodiment, includes performing the ATPG that generates the scan-test vectors for testing an operating speed of a plurality of speed paths. The testing for the manufacturing defect in the programmable integrated circuit implementing the specific user design includes double stepping a clock signal for the logic registers for testing for the manufacturing defect that limits the operating speed of the speed paths between the user registers in the specific user design implemented in the programmable resources of the programmable integrated circuit.

In another embodiment, the testing for the manufacturing defect in the programmable integrated circuit implementing the specific user design includes writing configuration data into a configuration memory of the programmable integrated circuit. The configuration data configures the programmable resources to implement the specific user design, including implementing the user registers in the portion of the logic registers. The testing also includes modifying, via the configuration port, the configuration data in the configuration memory with an initial state of the user registers in the access-test vector. The portion of the logic registers is initialized from the initial state in the configuration memory as part of the testing. The testing also includes stepping a clock signal for the user registers implemented in the portion of the logic registers and sampling a final state of the portion of the logic registers into the configuration memory. The final state of the portion of the logic registers is read from the configuration memory via the configuration port, and the testing determines the programmable integrated circuit implementing the specific user design does not have the manufacturing defect in response to the final state matching an expected state of the user registers in the access-test vector.

The initializing includes, in another embodiment, asserting an initialize signal of the programmable integrated circuit and the sampling includes asserting a sample signal of the programmable integrated circuit. The asserting of the initialize signal initializes all of the logic registers from the configuration memory, including initializing the portion of the logic registers from a plurality of bits contained within a plurality of addressable words of the configuration memory. The final state includes the final state for all of the logic registers. The asserting of the sample signal samples the final state of all of the logic registers into the configuration memory, including sampling the final state of the portion of the logic registers into the bits contained within the addressable words of the configuration memory.

In another embodiment, the modifying of the configuration data includes writing the addressable words of the configuration memory with the initial state replacing the bits of the addressable words within the configuration data. The reading of the final state of the portion of the logic registers includes extracting the final state of the portion of the logic registers from the bits of the addressable words read from the configuration memory.

The stepping of the clock signal, in another embodiment, includes a double stepping of the clock signal. The determining that the programmable integrated circuit implementing the specific user design implemented does not have the manufacturing defect includes testing an operating speed of the specific user design implemented in the programmable integrated circuit.

One or more embodiments provide a system for testing a programmable integrated circuit that includes programmable resources, a configuration memory, and a configuration port, with the programmable logic resources including some logic registers. The configuration memory is coupled to the programmable resources for configuring the programmable resources to implement any of a plurality of user designs and for initializing and sampling the logic registers. The configuration port is coupled to the configuration memory for writing and reading the configuration memory. The configuration port has already written the configuration memory with configuration data for configuring the programmable resources to implement a specific user design, including implementing user registers of the specific user design in a portion of the logic registers. A tester is coupled to the configuration port of the programmable integrated circuit. The tester generates scan-test vectors using automatic test pattern generation (ATPG). The scan-test vectors serially scan the portion of the logic registers via a virtual scan chain. The tester converts the scan-test vectors into access-test vectors that access the portion of the logic registers via the configuration port of the programmable integrated circuit. The tester modifies the configuration data in the configuration memory with an initial state for each access-test vector. The tester initializes the portion of the logic registers from the initial state in the configuration memory. The tester steps the clock signal for the user registers implemented in the portion of the logic registers. The tester samples a final state of the portion of the logic registers into the configuration memory. The tester reads the final state of the portion of the logic registers from the configuration memory. The tester tests whether the final state matches an expected state for the access-test vector.

The tester, in another embodiment, generates a netlist representing the programmable resources that implement the specific user design. The netlist represents the programmable resources as configured by the configuration data. The tester also adds the virtual serial-scan chain to the netlist.

In another embodiment, for each access-test vector, the tester issues an initialize command to the configuration port for initializing the portion of the logic registers from the initial state in the configuration memory, issues a step command to the configuration port for stepping the clock signal for the logic registers implemented in the portion of the logic registers, and issues a sample command to the configuration port for sampling the final state of the portion of the logic registers into the configuration memory.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

The testing of a programmable integrated circuit may ensure that the programmable integrated circuit does not have a manufacturing defect that adversely affects its operation regardless of the subsequent programming of the programmable integrated circuit. However, many programmable integrated circuits are programmed to implement specific user designs for particular electronic products and are never reprogrammed to implement another user design. Many potential manufacturing defects do not affect the operation of a programmable integrated circuit implementing a specific user design because the specific user design generally does not use all the programmable resources of the programmable integrated circuit. In one or more embodiments, testing is simplified because the unused programmable resources are minimally tested, and manufacturing yield is increased because certain manufacturing defects are benign and do not affect the operation of the specific user design implemented in the programmable integrated circuit.

Figure 1:
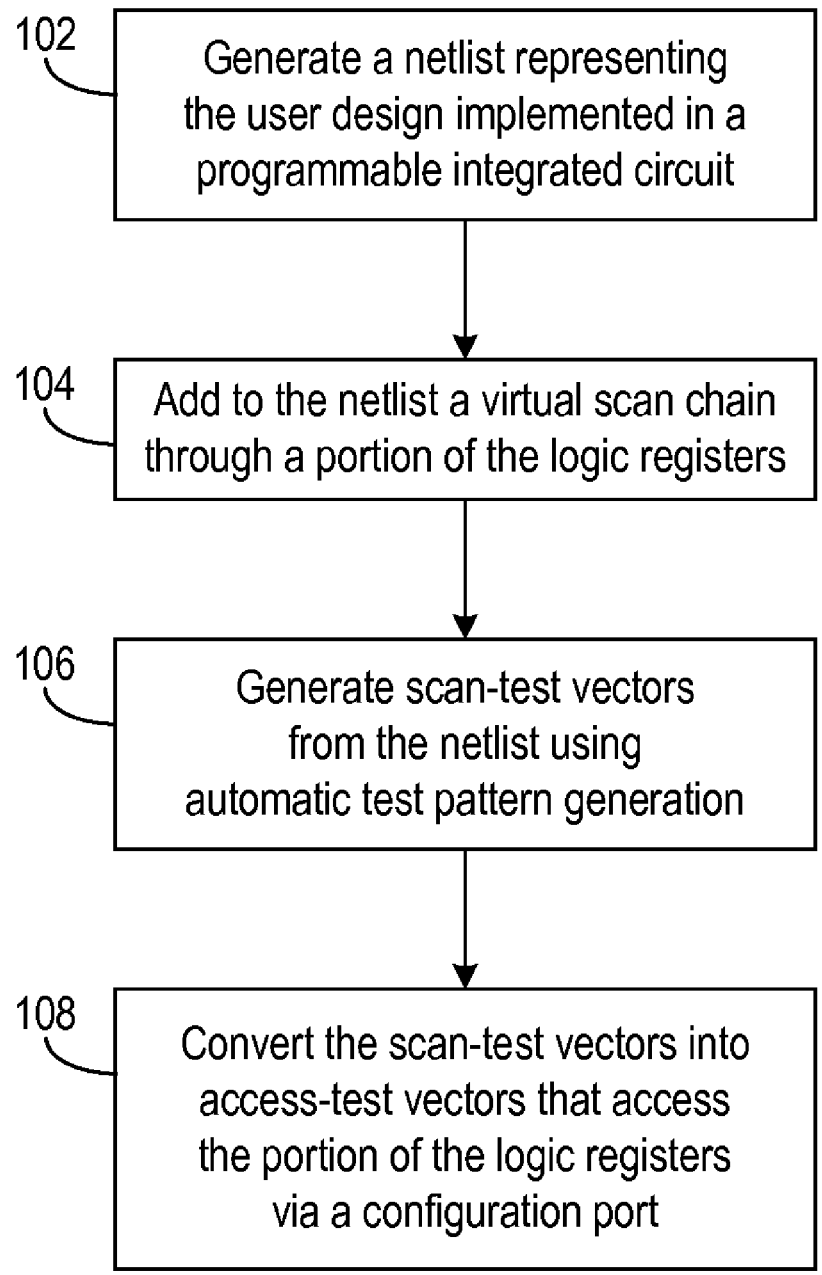
FIG. 1 is a flow diagram of a process for generating a manufacturing test for a programmable integrated circuit implementing a specific user design.

FIG. 1 is a flow diagram of a process for generating a manufacturing test for a programmable integrated circuit implementing a specific user design. In one embodiment, one or more processors are programmed to perform the operations shown in FIG. 1.

At block 102, a netlist is generated that represents the specific user design implemented in an array of programmable logic and interconnect resources of the programmable integrated circuit. The specific user design includes user registers and the generated netlist represents the user registers implemented in a portion of the logic registers of the programmable logic resources. In one embodiment, a specification of the specific user design is input and mapped into the array of the programmable logic and interconnect resources of the programmable integrated circuit. This produces a circuit description of the specific user design implemented in the mapped resources, and the netlist is generated from this circuit description.

A virtual scan chain is added to the netlist at block 104. The virtual scan chain passes through the portion of the logic registers that implement the user registers. The virtual scan chain does not actually exist in either the specific user design or the programmable integrated circuit. However, the virtual scan chain prepares the netlist for processing by automatic test pattern generation (ATPG) tools that require an existing scan chain. Thus, readily available ATPG tools can generate scan-test vectors for the programmable integrated circuit even though the programmable integrated circuit and the specific user design do not have a scan chain.

At block 106, an ATPG produces scan-test vectors from the netlist. Each scan-test vector serially scans the logic registers that implement the user registers via the virtual scan chain. Each scan-test vector serially scans these logic registers to initialize the user registers and to sample the final state of the user registers.

In one embodiment, an ATPG tool generates the scan-test vectors to collectively cover all the modeled manufacturing defects of the specific user design implemented in the programmable resources. In one example, the fault model models stuck-at faults, and the scan-test vectors cover all potential stuck-at faults of the specific user design implemented in the programmable resources.

At block 108, the scan-test vectors are converted into access-test vectors. Instead of serial scanning through the virtual scan chain, the access-test vectors use a configuration port of the programmable integrated circuit to access the logic registers that implement the user registers. The access-test vectors generally provide the same test coverage as the scan-test vectors, and the access-test vectors can test the programmable integrated circuit and its implementation of the specific user design even though the programmable integrated circuit and the specific user design do not have a scan chain.

Figure 2:
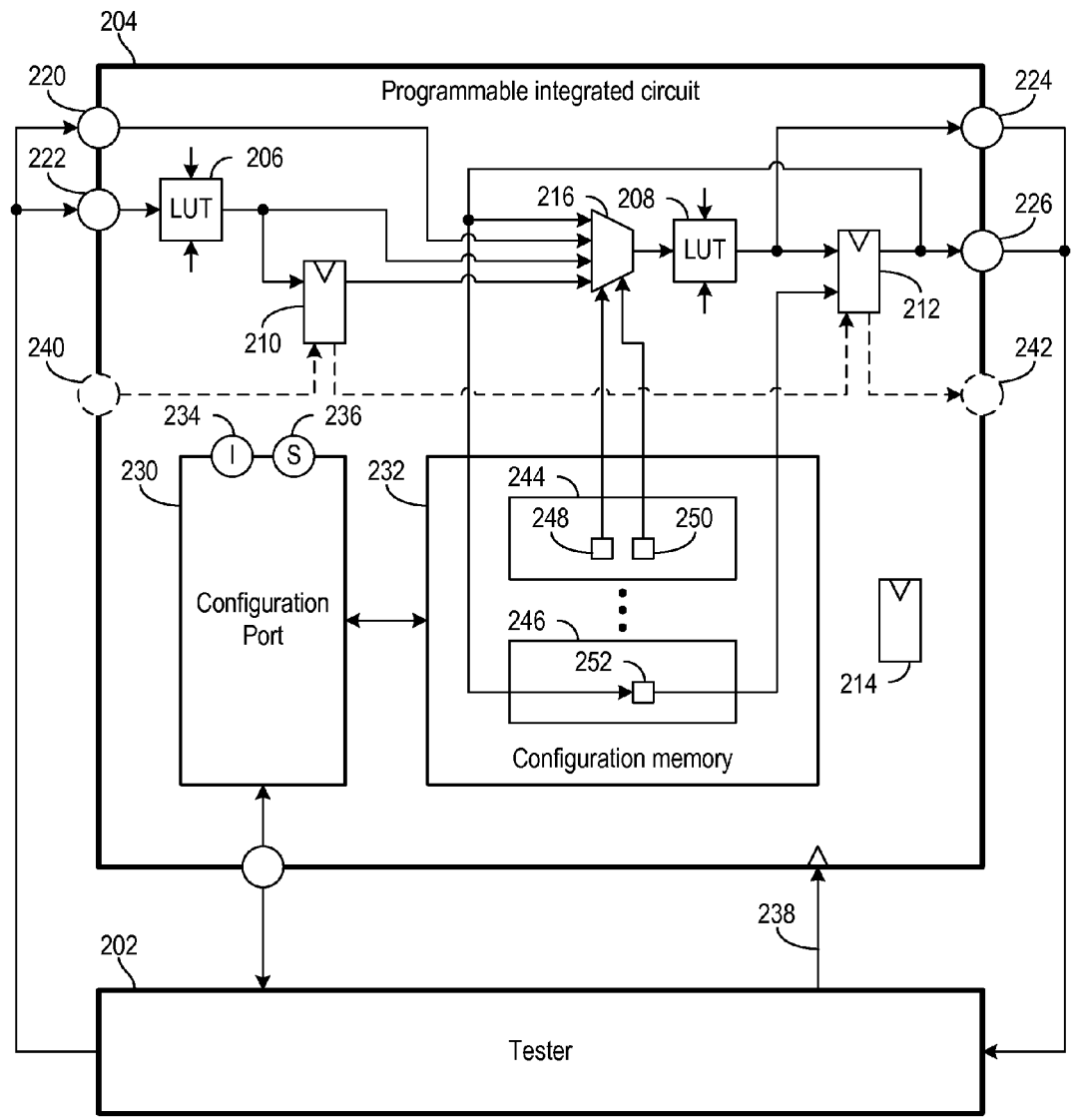
FIG. 2 is a block diagram of a system for testing a programmable integrated circuit implementing a specific user design.

FIG. 2 is a block diagram of a system for testing a programmable integrated circuit implementing a specific user design. The system includes a tester 202 that generates and applies test vectors that check whether programmable integrated circuit 204 has certain manufacturing defects.

The programmable integrated circuit 204 includes an array of programmable logic and interconnect resources, including look-up tables 206 and 208 and logic registers 210, 212, and 214 of the programmable logic resources, and multiplexer 216 and input/output pins 220, 222, 224, and 226 of the programmable interconnect resources.

During initialization, the tester 202 or another device, such as a non-volatile memory, commands the configuration port 230 to write configuration data for the specific user design into the configuration memory 232. This configuration data configures the programmable resources to implement the specific user design. This includes configuring the contents of the lookup-tables 206 and 208 to implement the logic functions of the specific user design and configuring the multiplexer 216 to interconnect these logic functions with the input/output pins 220, 222, 224, and 226 and the logic registers 210, 212, and 214. In this example, the user registers are implemented in the portion (or subset) of the logic registers that includes logic registers 210 and 212 (the user registers are not implemented using logic register 214).

The initialization also includes setting the initial state of the logic registers 210, 212, and 214. The configuration data written into configuration memory 232 includes this initial state. In one embodiment, the configuration port 230 is controllable to assert an initialize signal 234 that resets the logic registers 210, 212, and 214 to the initial state from configuration memory 232. Thus, tester 202 can reset the initial state of the specific user design from configuration memory 232 by commanding the configuration port 230 to assert the initialize signal 234.

In one embodiment, the configuration port 230 is controllable to assert sample signal 236 that transfers the current state of the logic registers 210, 212, and 214 to configuration memory 232. Tester 202 can obtain this current state by commanding configuration port 230 to read the current state from the appropriate locations in configuration memory 232.

When the sample signal 236 is asserted, the current state of the logic registers 210, 212, and 214 overwrites the initial state in configuration memory 232 in one embodiment. Thus, after asserting the sample signal 236, the initial state should generally be rewritten into configuration memory 232 before asserting the initialize signal 234.

Each access-test vector specifies an initial state for the user registers and an expected final state for the user registers. Near the beginning of the test for each access-test vector, the tester 202 commands configuration port 230 to write the initial state into the appropriate locations in configuration memory 232. This modifies the stored configuration data for the user design. Then tester 202 commands the configuration port 230 to assert the initialize signal 234 to initialize the logic registers 210, 212, and 214 from configuration memory 232. The logic registers 210 and 212 that implement the user registers are initialized to the initial state and the remaining logic register 214 is initialized to a default state. During each test, tester 202 applies input values to the input pins 220 and 222, steps a clock signal on line 238 for the logic registers 210, 212, and 214, and captures output values from the output pins 224 and 226. Near the end of the test for each access-test vector, tester 202 commands the configuration port 230 to assert the sample signal 236 to sample the final state of the logic registers 210, 212, and 214 in configuration memory 232. Then the tester 202 commands configuration port 230 to read the final state logic of the registers 210 and 212 from the appropriate locations in configuration memory 232. The access-test vector detects a manufacturing defect when the final state of the user registers does not match the expected state of the user registers.

Tester 202 adds a virtual scan chain (shown in FIG. 2 with dashed lines) through the portion of the logic registers that implement the user registers of the specific user design. In one embodiment, a netlist represents the programmable resources as configured by the configuration data stored in configuration memory 232, and tester 202 adds the virtual scan chain to the netlist. This virtual scan chain has a virtual input pin 240 and a virtual output pin 242, and the virtual scan chain forms a shift register that serially shifts data from the virtual input pin 240 through the logic registers 210 and 212 to the virtual output pin 242. If the virtual scan chain actually existed, a tool for automatic test pattern generation (ATPG) could initialize and sample the logic registers 210 and 212 by serially shifting the initial state into virtual input pin 240 and serially shifting the final state out of virtual output pin 242.

Since the virtual scan chain does not physically exist, the ATPG tool generates scan-test vectors from the netlist that includes the virtual scan chain, and those scan-test vectors are then converted for use with the actual programmable integrated circuit 204. The tester 202 uses an ATPG tool to generate scan-test vectors that would serially scan the initial and final state through the logic registers 210 and 212 via the virtual scan chain. The tester 202 converts the scan-test vectors into access-test vectors that instead access the logic registers 210 and 212 via the configuration port 230 of the programmable integrated circuit. The tester 202 tests the programmable integrated circuit 204 with each access-test vector while the programmable integrated circuit 204 is implementing the specific user design. The tester 202 tests whether the final state matches the expected state for each access-test vector to test the programmable integrated circuit 204 for manufacturing defects.

In one embodiment, the configuration memory 232 includes words, such as words 244 and 246. During a read or write access, the configuration port 230 identifies the accessed word with a unique address for the word. The addressable word 244 includes bits 248 and 250 that store values for configuring the multiplexer 216 to connect the input of look-up table 208 to input pin 220, an output of look-up table 206, an output of logic register 210, or feedback from logic register 212. The actual values of bits 248 and 250 of addressable word 244 in the configuration data stored in configuration memory 232 depends on the configuration needed to implement the specific user design. Look-up tables 206 and 208 are similarly configured. The addressable word 246 includes bit 252 for initializing and sampling the state of logic register 212. When the initialize signal 234 is asserted, the state of logic register 212 is initialized to the value of bit 252 contained within addressable word 246, and when the sample signal 236 is asserted, the current state of logic register 212 is transferred to bit 252. Logic registers 210 and 214 can be similarly initialized and sampled.

Near the beginning of each access-test vector, the tester 202 creates a value for addressable word 246 with the initial state for logic register 212 replacing the original value of bit 252. Then tester 202 commands configuration port 230 to write addressable word 246 with the created value, and the tester 202 issues an initialize command to configuration port 230 to initialize the logic registers 210, 212, and 214 using the initialize signal 234. Near the end of each access-test vector, the tester 202 issues a sample command to configuration port 230 to sample the final state of the logic registers 210, 212, and 214 using the sample signal 236, and the tester 202 commands configuration port 230 to read a value from addressable word 246 that has the final state of register 212 in bit 252. Then tester 202 extracts the final state of logic register 212 from the value read from addressable word 246.

Figure 3:
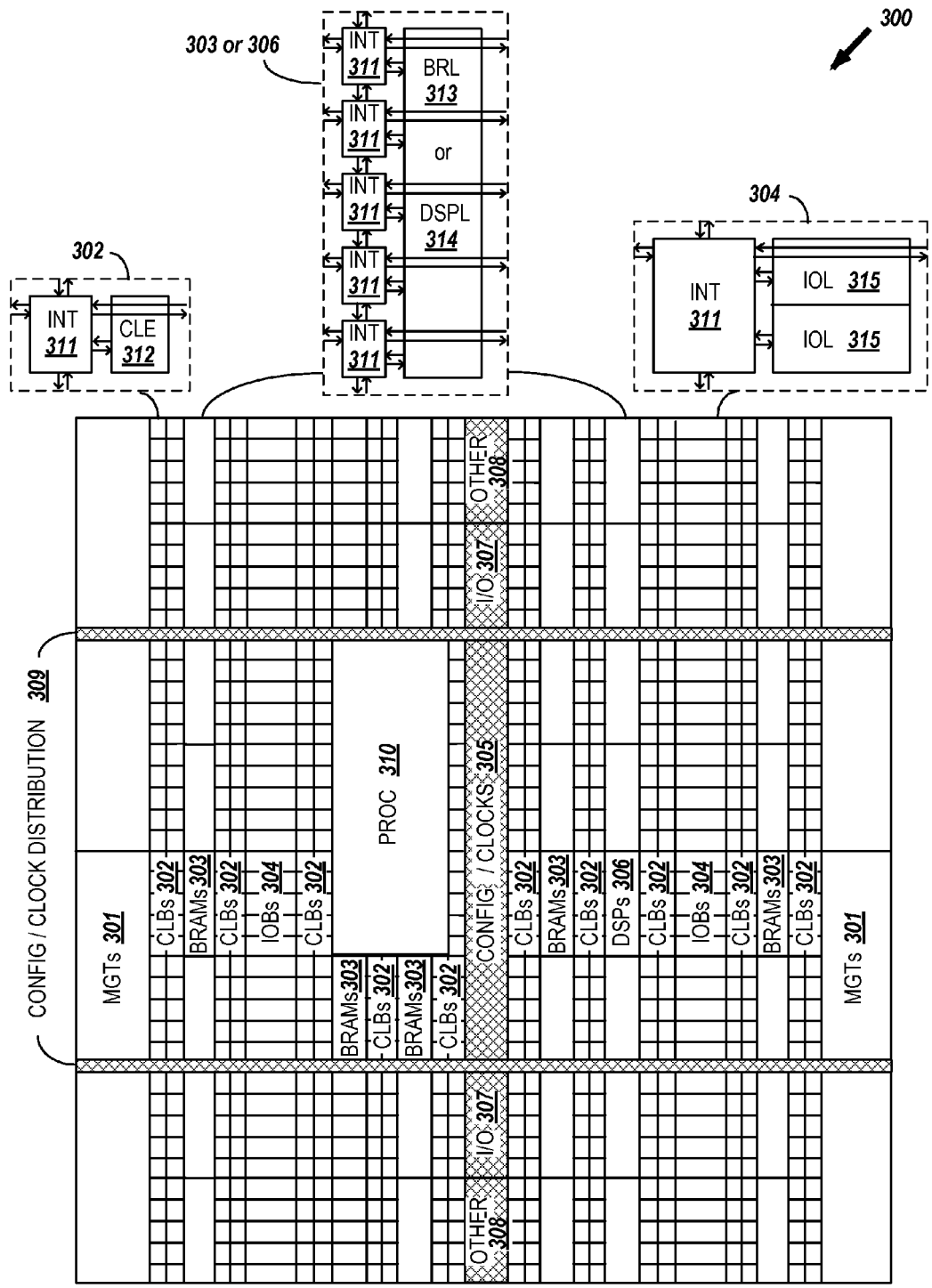
FIG. 3 is a block diagram of a programmable integrated circuit that implements a specific user design and can be tested in accordance with the methods described herein.

FIG. 3 is a block diagram of a programmable integrated circuit that implements a specific user design and can be tested in accordance with the methods described herein.

FPGAs can include several different types of programmable logic blocks in the array. For example, FIG. 3 illustrates an FPGA architecture (300) that includes a large number of different programmable tiles including multi-gigabit transceivers (MGTs 301), configurable logic blocks (CLBs 302), random access memory blocks (BRAMs 303), input/output blocks (IOBs 304), configuration and clocking logic (CONFIG/CLOCKS 305), digital signal processing blocks (DSPs 306), specialized input/output blocks (I/O 307), for example, e.g., clock ports, and other programmable logic 308 such as digital clock managers, analog to-digital converters, system monitoring logic, and so forth. Some FPGAs also include dedicated processor blocks (PROC 310) and internal and external reconfiguration ports (not shown).

In some FPGAs, each programmable tile includes a programmable interconnect element (INT 311) having standardized connections to and from a corresponding interconnect element in each adjacent tile. Therefore, the programmable interconnect elements taken together implement the programmable interconnect structure for the illustrated FPGA. The programmable interconnect element INT 311 also includes the connections to and from the programmable logic element within the same tile, as shown by the examples included at the top of FIG. 3.

For example, a CLB 302 can include a configurable logic element CLE 312 that can be programmed to implement user logic plus a single programmable interconnect element INT 311. A BRAM 303 can include a BRAM logic element (BRL 313) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 306 can include a DSP logic element (DSPL 314) in addition to an appropriate number of programmable interconnect elements. An IOB 304 can include, for example, two instances of an input/output logic element (IOL 315) in addition to one instance of the programmable interconnect element INT 311. As will be clear to those of skill in the art, the actual I/O pads connected, for example, to the I/O logic element 315 are manufactured using metal layered above the various illustrated logic blocks, and typically are not confined to the area of the input/output logic element 315.

In the pictured embodiment, a columnar area near the center of the die (shown shaded in FIG. 3) is used for configuration, clock, and other control logic. Horizontal areas 309 extending from this column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, the processor block PROC 310 shown in FIG. 3 spans several columns of CLBs and BRAMs.

Note that FIG. 3 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 3 are purely exemplary. For example, in an actual FPGA more than one adjacent column of CLBs is typically included wherever the CLBs appear, to facilitate the efficient implementation of user logic.

Figure 4:
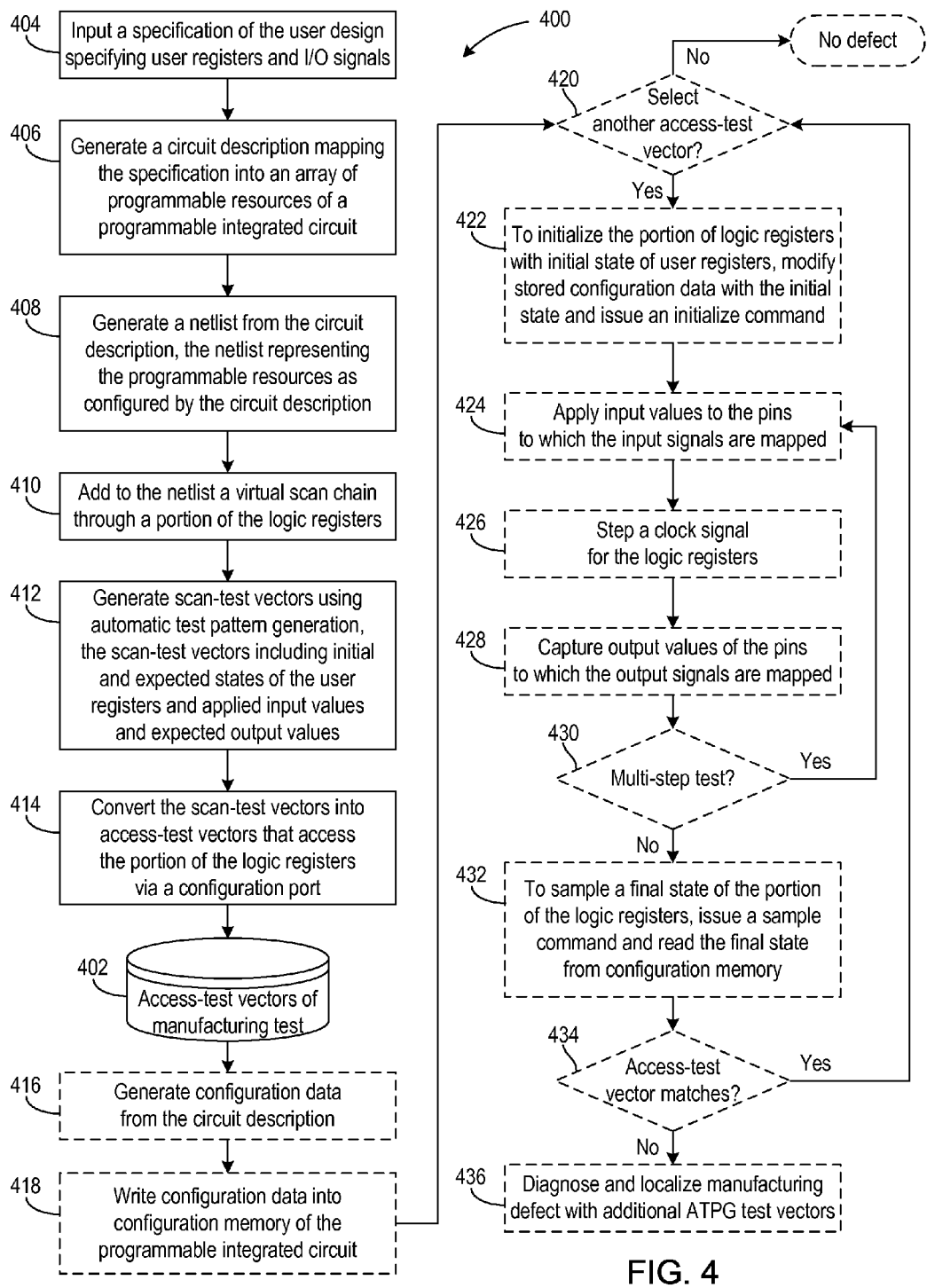
FIG. 4 is a flow diagram of an example process for testing a programmable integrated circuit implementing a specific user design.

FIG. 4 is a flow diagram of an example process 400 for testing a programmable integrated circuit implementing a specific user design. Process 400 generates the access-test vectors of manufacturing test 402. Process 400 optionally applies the manufacturing test 402, as shown by the blocks in dotted outlines.

At block 404, a specification of the specific user design is input, and this specification specifies the user registers and input/output signals of the specific user design. At block 406, a circuit description is generated that maps the specification into an array of programmable logic and interconnect resources of the programmable integrated circuit. The user registers are mapped into a portion of the logic registers and the input/output signals are mapped to pins of the programmable interconnect resources of the programmable integrated circuit. At block 408, a netlist is generated from the circuit description. The netlist represents the programmable resources as configured by the circuit description.

At block 410, a virtual scan chain is created through the logic registers that implement the user registers of the specific user design, and this virtual scan chain is added to the netlist.

At block 412, scan-test vectors are generated from the netlist using automatic test pattern generation (ATPG). Each scan-test vector includes initial and expected final states of the user registers, input values applied to the input signals of specific user design, and output values expected from the output signals of the specific user design. At block 414, the scan-test vectors are converted into the access-test vectors of the manufacturing test 402 for the programmable integrated circuit.

At block 416, configuration data is generated from the circuit description. At block 418, the configuration data is stored in the configuration memory of the programmable integrated circuit via its configuration port. The configuration data stored in the configuration memory configures the programmable logic and interconnect resources of the programmable integrated circuit. The stored configuration data configures the programmable resources to implement the specific user design.

As long as there is another access-test vector to be selected, an access-test vector of the manufacturing test 402 is selected at block 420. At block 422, the configuration data stored in the configuration memory is modified via the configuration port to include the initial state from the selected access-test vector, and an initialize command is issued to the configuration port. This initializes the portion of the logic registers that implement the user registers with the initial state.

At block 424 the input values are applied to the pins of the programmable integrated circuit that implement the input signals of the specific user design. At block 426, a clock signal for the logic registers is stepped by issuing a step command to the configuration port of the programmable integrated circuit. At block 428, the actual output values are captured from the pins of the programmable integrated circuit that implement the output signals of the specific user design. In one embodiment, the stepping of the clock signals occurs during the application of the input values and the capture of the output values.

In one embodiment, one or more of the scan-test vectors generated at block 412 test an operating speed of speed paths between the implemented user registers. At block 430, process 400 checks for a multi-step test by determining whether the current access-test vector corresponds to such a scan-test vector. If the current access-test vector tests speed paths, process 400 returns to block 424 to double step the clock signal and test the operating speed of the specific user design implemented in the programmable integrated circuit. This checks for certain manufacturing defects that limit the operating speed of these speed paths.

At block 432, a sample command is issued to the configuration port to transfer the final state of the logic registers from configuration memory. While the sample command samples the final state of all of the logic registers from the configuration memory, only the final state of the logic registers implementing the user registers is read from the configuration memory via the configuration port in one embodiment.

At block 434, process 400 checks whether the final state matches the expected state for the user registers, and whether the output values match the expected values for the output signals. For actual results not matching expected results, process 400 proceeds to block 436 to analyze the detected manufacturing defect. For actual results matching expected results, process 400 returns to block 420 to test the next access-test vector. If all access-test vectors have matching final and expected states and matching actual and expected output values, process 400 determines the programmable integrated circuit implementing the specific user design does not have any manufacturing defect.

For a manufacturing screening test, the detection of unexpected results for a particular programmable integrated circuit is sufficient to mark the particular programmable integrated circuit as defective. Detection of unexpected results includes one or more bits of the final state not matching the corresponding one or more bits of the expected state.

Analysis of the cause of the manufacturing defect is often needed to monitor and/or improve the manufacturing process, or to redesign the programmable integrated circuit to increase tolerance for recurring manufacturing defects. Many ATPG tools include interactive generation of additional scan-test vectors to diagnose and localize a manufacturing defect detected by manufacturing test 402. In one embodiment, the scan-test vectors generated at block 412 include such additional scan-test vectors that augment manufacturing test 402. The corresponding access-test vectors diagnose and localize the detected manufacturing defect.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable storage media or delivery channels such as magnetic or optical disks or tapes, electronic storage devices, or as application services over a network.

The embodiments of the present invention are thought to be applicable to a variety of systems for testing for manufacturing defects. Other aspects and embodiments will be apparent to those skilled in the art from consideration of the specification and practice of the invention disclosed herein. The embodiments may be implemented as one or more processors configured to execute software, as an application specific integrated circuit (ASIC), or as a logic on a programmable logic device. It is intended that the specification and illustrated embodiments be considered as examples only, with a true scope and spirit of the invention being indicated by the following claims.

What is claimed is:

1. A method of generating a manufacturing test of a programmable integrated circuit, comprising:
using at least one programmed processor to perform operations including:
generating a netlist representing a specific user design implemented in programmable resources of the programmable integrated circuit, wherein the netlist represents a plurality of user registers of the specific user design implemented in a portion of a plurality of logic registers of the programmable resources;
adding to the netlist a virtual scan chain through the portion of the logic registers;
generating a plurality of scan-test vectors from the netlist using automatic test pattern generation (ATPG), wherein the scan-test vectors serially scan the portion of the logic registers via the virtual scan chain; and
converting the scan-test vectors into a plurality of access-test vectors that access the portion of the logic registers via a configuration port of the programmable integrated circuit.

2. The method of claim 1, wherein the adding of the virtual scan chain to the netlist includes adding to the netlist the virtual scan chain that does not exist in the programmable integrated circuit and does not exist in the specific user design implemented in the programmable resources of the programmable integrated circuit.

3. The method of claim 1, wherein the generating of the scan-test vectors includes performing the ATPG that generates the scan-test vectors which collectively cover all of a plurality of potential stuck-at faults of the specific user design implemented in the programmable resources.

4. The method of claim 1, wherein the generating of the netlist includes:
inputting a specification of the specific user design;
generating a circuit description mapping the specification into the programmable resources of the programmable integrated circuit; and
generating the netlist from the circuit description.

5. A method for manufacturing testing of a programmable integrated circuit that is implementing a specific user design, comprising:
using at least one programmed processor to perform operations including:
generating a netlist representing the specific user design implemented in programmable resources of the programmable integrated circuit, wherein the netlist represents a plurality of user registers of the specific user design implemented in a portion of a plurality of logic registers of the programmable resources;
adding to the netlist a virtual scan chain through the portion of the logic registers;
generating a plurality of scan-test vectors from the netlist using automatic test pattern generation (ATPG), wherein the scan-test vectors serially scan the portion of the logic registers via the virtual scan chain;
converting the scan-test vectors into a plurality of access-test vectors that access the portion of the logic registers via a configuration port of the programmable integrated circuit; and
testing whether the programmable integrated circuit has a manufacturing defect, including testing the programmable integrated circuit implementing the specific user design with each of the access-test vectors via the configuration port.

6. The method of claim 5, wherein the generating of the netlist includes:
inputting a specification of the specific user design;
generating a circuit description mapping the specification into the programmable resources of the programmable integrated circuit; and
generating the netlist from the circuit description.

7. The method of claim 6, wherein the testing for the manufacturing defect in the programmable integrated circuit includes:

generating configuration data from the circuit description; and storing the configuration data in a configuration memory of the programmable integrated circuit via the configuration port, wherein the programmable integrated circuit implements the specific user design in response to the configuration memory storing the configuration data.

8. The method of claim 7, wherein:

the inputting of the specification includes inputting the specification specifying the user registers and a plurality of input and output signals of the specific user design;

the generating of the circuit description includes generating the circuit description mapping the user registers into the portion of the logic registers, and mapping the input and output signals to a plurality of pins of the programmable resources of the programmable integrated circuit;

the generating of the netlist from the circuit description includes generating the netlist representing the programmable resources that implement the specific user design, the netlist representing the programmable resources as configured by the configuration data stored in the configuration memory; and the generating of the scan-test vectors includes generating an initial state and an expected state for the user registers implemented in the portion of the logic registers, and generating a plurality of input values for the input signals and a plurality of expected values for the output signals.

9. The method of claim 8, wherein the testing of the programmable integrated circuit with each of the access-test vectors includes:

initializing the portion of the logic registers with the initial state via the configuration port and the configuration memory;

applying the input values to the pins to which the input signals are mapped;

capturing a plurality of output values from the pins to which the output signals are mapped;

sampling a final state of the portion of the logic registers via the configuration memory and the configuration port; and determining the programmable integrated circuit implementing the specific user design does not have the manufacturing defect in response to the output values matching the expected values and the final state matching the expected state.

10. The method of claim 9, wherein:

the testing of the programmable integrated circuit with the access-test vector includes stepping a clock signal for the portion of the logic registers during the applying and the capturing;

the initializing includes writing the initial state into a plurality of addressable words within the configuration memory via the configuration port, and issuing an initialize command to the configuration port for initializing all of the logic registers from the configuration memory, including transferring the initial state from the addressable words within the configuration memory to the portion of the logic registers; and the sampling of the final state includes issuing a sample command to the configuration port for sampling all of the logic registers into the configuration memory, including transferring the final state from the portion of the logic registers to the addressable words within the configuration memory, and reading the final state from the addressable words within the configuration memory via the configuration port.

11. The method of claim 5, wherein:

the generating of the scan-test vectors includes generating each scan-test vector specifying an initial and expected state of the user registers; and the testing of the programmable integrated circuit with each of the access-test vectors includes determining the programmable integrated circuit implementing the specific user design has the manufacturing defect in response to, for the access-test vector that corresponds to each of the scan-test vectors, a final state of the portion of the logic registers for the access-test vector not matching the expected state of the user registers for the scan-test vector.

12. The method of claim 11, wherein:

the generating of the scan-test vectors further includes a tool for the ATPG generating the scan-test vectors augmented with at least one additional scan-test vector for diagnosing and localizing the manufacturing defect in response to at least one bit of the final state not matching a corresponding at least one bit of the expected state; and the testing for the manufacturing defect in the programmable integrated circuit includes diagnosing and localizing the manufacturing defect in response to testing the programmable integrated circuit via the configuration port with the access-test vectors that correspond to the at least one additional scan-test vector.

13. The method of claim 5, wherein:

the generating of the scan-test vectors includes performing the ATPG that generates the scan-test vectors for testing an operating speed of a plurality of speed paths; and the testing for the manufacturing defect in the programmable integrated circuit implementing the specific user design includes double stepping a clock signal for the logic registers for testing for the manufacturing defect that limits the operating speed of the speed paths between the user registers in the specific user design implemented in the programmable resources of the programmable integrated circuit.

14. The method of claim 5, wherein the testing for the manufacturing defect in the programmable integrated circuit implementing the specific user design includes:

writing configuration data into a configuration memory of the programmable integrated circuit, the configuration data configuring the programmable resources to implement the specific user design, including implementing the user registers in the portion of the logic registers;

via the configuration port, modifying the configuration data in the configuration memory with an initial state of the user registers in the access-test vector;

initializing the portion of the logic registers from the initial state in the configuration memory;

stepping a clock signal for the user registers implemented in the portion of the logic registers;

sampling a final state of the portion of the logic registers into the configuration memory;

via the configuration port, reading the final state of the portion of the logic registers from the configuration memory; and determining the programmable integrated circuit implementing the specific user design does not have the manufacturing defect in response to the final state matching an expected state of the user registers in the access-test vector.

15. The method of claim 14, wherein:

the initializing includes asserting an initialize signal of the programmable integrated circuit and the sampling includes asserting a sample signal of the programmable integrated circuit;

the asserting of the initialize signal initializes all of the logic registers from the configuration memory, including initializing the portion of the logic registers from a plurality of bits contained within a plurality of addressable words of the configuration memory, the final state including the final state for all of the logic registers; and the asserting of the sample signal samples the final state of all of the logic registers into the configuration memory, including sampling the final state of the portion of the logic registers into the bits contained within the addressable words of the configuration memory.

16. The method of claim 15, wherein:

the modifying of the configuration data includes writing the addressable words of the configuration memory with the initial state replacing the bits of the addressable words within the configuration data; and the reading of the final state of the portion of the logic registers includes extracting the final state of the portion of the logic registers from the bits of the addressable words read from the configuration memory.

17. The method of claim 14, wherein:

the stepping of the clock signal includes a double stepping of the clock signal; and the determining the programmable integrated circuit implementing the specific user design implemented does not have the manufacturing defect includes testing an operating speed of the specific user design implemented in the programmable integrated circuit.

\* \* \* \* \*